(12) United States Patent
Bianchi

(10) Patent No.: US 11,148,384 B2
(45) Date of Patent: Oct. 19, 2021

(54) THERMO INDUCTION PRESS FOR WELDING PRINTED CIRCUITS AND METHOD CARRIED OUT THEREOF

(71) Applicant: CEDAL EQUIPMENT CO., LTD., Apia (WS)

(72) Inventor: Marco Bianchi, Varese (IT)

(73) Assignee: CEDAL EQUIPMENT CO., LTD., Apia (WS)

( * ) Notice: Subject to any disclaimer, the term of this patent is extended or adjusted under 35 U.S.C. 154(b) by 163 days.

(21) Appl. No.: 16/066,784

(22) PCT Filed: Dec. 5, 2016

(86) PCT No.: PCT/IB2016/057357
§ 371 (c)(1),
(2) Date: Jun. 28, 2018

(87) PCT Pub. No.: WO2017/115178
PCT Pub. Date: Jul. 6, 2017

(65) Prior Publication Data
US 2019/0016080 A1    Jan. 17, 2019

(30) Foreign Application Priority Data

Dec. 28, 2015   (IT) .......................... 102015000088139

(51) Int. Cl.
*B30B 15/06*       (2006.01)
*B30B 1/42*        (2006.01)
(Continued)

(52) U.S. Cl.
CPC ............. *B30B 15/064* (2013.01); *B30B 1/42* (2013.01); *H05B 6/36* (2013.01); *H05K 3/4652* (2013.01);
(Continued)

(58) Field of Classification Search
CPC . B30B 15/064; B30B 1/42; B32B 2310/0812; B32B 2457/08; H05B 6/36;
(Continued)

(56) References Cited

U.S. PATENT DOCUMENTS 4,650,947 A    3/1987   Hutton et al.
4,681,649 A *  7/1987   Fazlin .................... B32B 37/06
                                                 156/285

(Continued)

FOREIGN PATENT DOCUMENTS

CN    101678570 A    3/2010
DE    3539990        2/1984
(Continued)

OTHER PUBLICATIONS

Translation TW411732 (Year: 2020).*
(Continued)

*Primary Examiner* — Ibrahime A Abraham
*Assistant Examiner* — Frederick F Calvetti
(74) *Attorney, Agent, or Firm* — Muncy, Geissler, Olds & Lowe, P.C.

(57) ABSTRACT

The invention regards a press for soldering multilayer stacks for printed circuits, with an outer muffle that encloses soldering chambers where multilayer stacks are arranged to be heated, inducing a magnetic flux. For such purpose, the press is provided with an inductor having winding form which is arranged on a mobile piston adapted to apply a force on the multilayer stack, such to generate a magnetic flux at its interior that is spatially uniform and regular over time.

15 Claims, 7 Drawing Sheets

(51) Int. Cl.
  *H05B 6/36* (2006.01)
  *H05K 3/46* (2006.01)
(52) U.S. Cl.
  CPC ... *B32B 2310/0812* (2013.01); *B32B 2457/08* (2013.01); *H05K 3/4611* (2013.01); *H05K 2203/068* (2013.01); *H05K 2203/101* (2013.01)
(58) Field of Classification Search
  CPC ....... H05K 2203/068; H05K 2203/101; H05K 3/4611; H05K 3/4652
  See application file for complete search history.

(56) References Cited

U.S. PATENT DOCUMENTS

| | | | | |
|---|---|---|---|---|
| 5,176,839 | A * | 1/1993 | Kim | B29C 33/02 249/78 |
| 5,338,497 | A * | 8/1994 | Murray | B29C 33/08 264/257 |
| 5,483,043 | A * | 1/1996 | Sturman, Jr. | B29C 35/08 219/634 |
| 5,615,470 | A | 4/1997 | Ceraso | |
| 5,647,940 | A * | 7/1997 | Ceraso | B32B 37/10 156/273.9 |
| 6,139,777 | A * | 10/2000 | Omoya | H05K 1/095 156/306.3 |
| 7,148,776 | B2 * | 12/2006 | Day | B25B 11/002 335/289 |
| 7,565,736 | B2 * | 7/2009 | Lazaro Gallego | B32B 15/14 29/830 |
| 7,981,350 | B2 * | 7/2011 | Jaderberg | B29C 33/04 264/328.16 |
| 8,235,697 | B2 * | 8/2012 | Olin | B29C 45/2642 425/174.8 R |
| 8,268,226 | B2 * | 9/2012 | Vander Wel | B29C 43/36 264/257 |
| 8,545,201 | B2 * | 10/2013 | Wei | B29C 43/36 264/296 |
| 8,931,751 | B2 * | 1/2015 | Funke | B29C 33/40 249/80 |
| 9,662,812 | B2 * | 5/2017 | Chen | H01L 21/565 |
| 10,035,286 | B2 * | 7/2018 | Jaderberg | B29C 43/52 |
| 10,543,647 | B2 * | 1/2020 | Matsen | B29C 70/345 |
| 10,618,213 | B2 * | 4/2020 | Childers | B29C 70/50 |
| 2006/0213613 | A1 * | 9/2006 | Gallego | H05K 3/022 156/320 |
| 2009/0068306 | A1 * | 3/2009 | Jaderberg | B29C 33/04 425/547 |
| 2009/0184152 | A1 * | 7/2009 | Kimbara | B23K 3/0475 228/111 |
| 2009/0239023 | A1 * | 9/2009 | Olin | B29C 45/73 428/64.2 |
| 2009/0250456 | A1 * | 10/2009 | Lazaro Gallego | H05K 3/022 219/633 |
| 2010/0019359 | A1 * | 1/2010 | Pagaila | H01L 21/568 257/659 |
| 2010/0096754 | A1 * | 4/2010 | Lee | H01L 24/06 257/738 |
| 2010/0221373 | A1 * | 9/2010 | Chen | B29C 33/3828 425/3 |
| 2011/0006460 | A1 * | 1/2011 | Vander Wel | B29C 43/36 264/403 |
| 2012/0305197 | A1 * | 12/2012 | Wei | B30B 1/42 156/379 |
| 2013/0208390 | A1 * | 8/2013 | Singh | H01F 5/00 361/139 |
| 2013/0250618 | A1 * | 9/2013 | Nichol | G02B 6/0068 362/618 |
| 2013/0312809 | A1 * | 11/2013 | Luch | H01L 31/022425 136/244 |
| 2014/0367886 | A1 * | 12/2014 | Jaderberg | B29C 59/002 264/293 |
| 2020/0344924 | A1 * | 10/2020 | Harrigan | H05K 1/144 |

FOREIGN PATENT DOCUMENTS

| | | |
|---|---|---|
| DE | 3507568 | 9/1986 |
| DE | 4001835 | 7/1991 |
| EP | 1002639 | 5/2000 |
| GB | 1321305 | 6/1973 |
| GB | 2119710 | 11/1983 |
| IT | MI930224 | 8/1994 |
| IT | MI20030967 | 11/2004 |
| JP | 58197017 | 11/1983 |
| JP | 59185600 | 10/1984 |
| JP | 1255526 | 10/1989 |
| JP | 11188744 | 7/1999 |
| TW | 411732 | * 11/2000 |
| TW | I411732 | 11/2000 |
| WO | 9417976 | 8/1994 |
| WO | 2004103042 | 11/2004 |

OTHER PUBLICATIONS

Translation 600 (Year: 2021).*
"International Search Report and Written Opinion", PCT Application No. PCT/IB2016/057357, dated Jun. 20, 2017, 8 pages.
"International Search Report", Application No. PCT/IT93/00030, dated Jan. 12, 1994, 3 pages.
"International Search Report", Application No. PCT/IT03/00403, dated Jan. 16, 2004, 3 pages.

* cited by examiner

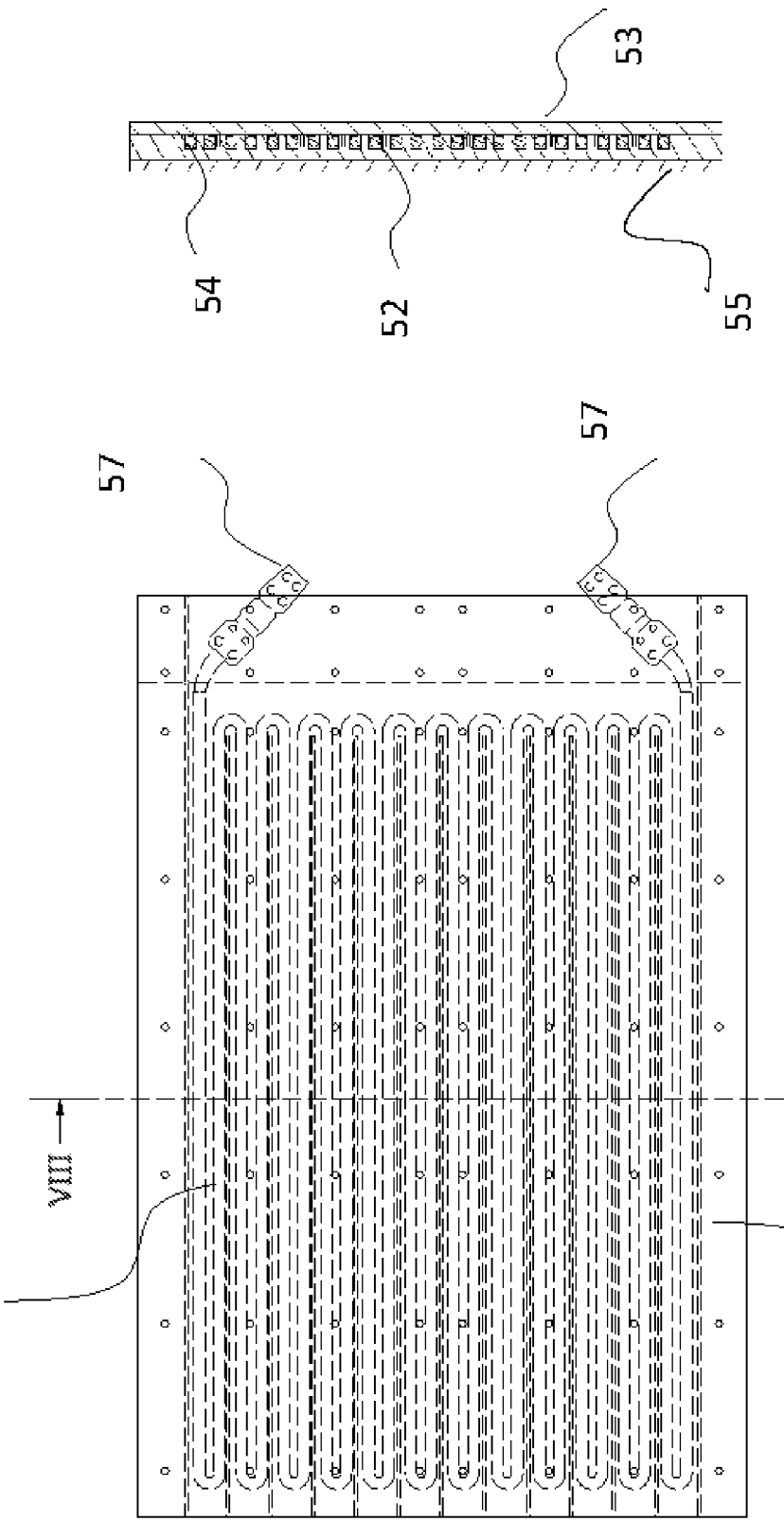

THERMO INDUCTION PRESS FOR WELDING PRINTED CIRCUITS AND METHOD CARRIED OUT THEREOF

The present invention refers to a method and an apparatus for soldering printed circuits.

In order to better understand the invention and the explanation that will follow, a brief description should first be given regarding the attainment of the relevant printed circuits.

As is known, indeed, the printed circuits for electronic applications such as those used in electronic processors (including those of personal type such as so-called personal computers, those for large data processing centers or so-caller servers which manage data networks), in telecommunications apparatuses (such as cell phones, electronic tablets, switchboards, etc.), in household appliances, in automobiles, in industrial plants among others, are obtained by overlapping multiple conductive layers or sheets incorporating the copper traces designed according the topography of the circuit, with layers of electrically insulating material interposed therebetween.

This configuration gives rise to a multilayer stack which, through subsequent processing and finishing steps, allows obtaining the final printed circuits; the latter can be of rigid type, such as circuit boards (the so-called PCB or printed circuit boards), or flexible like the circuits used for small apparatuses or associated with moving parts (strip circuits or films).

The different overlapped sheets or layers of the stack are joined closely together by means of a thermosetting adhesive (usually a resin), which impregnates an insulating substrate of textile, fibrous or similar type; the substrate is made of glass, synthetic fiber, aramid fibers or other threads of electrically insulating material, and is also commonly termed pre-preg.

The compaction and gluing of the conductive layers together with the non-conductive layers usually occurs in suitable presses, where the semifinished multilayer stack is subjected to a combined heating and compression cycle.

The applicant has in the past developed presses for these applications, which are essentially of two different types. The first is the endothermic or resistive type and is described in the Italian patent application MI93 A 000223 (of Oct. 2, 1993), published as WO9417976A1.

In accordance with this solution, the multilayer stacks of conductive and insulating sheets are stacked on each other, with copper metal sheets interposed therebetween. The latter sheets are electrically connected to each other in series, so as to circulate the electric current at their interior, thus producing via dissipation (Joule effect) the heat necessary for melting and polymerizing the adhesive resins.

By applying, in combination with the electrically generated heat, also a force on the pile of multilayer stacks, these are pressed so as to assume the final desired configuration and thickness; for this reason, the pile of multilayer stacks is inserted between two plates of the press, a lower base plate and an upper mobile plate, which squeeze the pile between them, thus compacting the layers and making the adhesive present therebetween to adhere.

The copper metal sheets interposed with the multilayer stacks allow bringing heat even to the central zones of the pile, thus facilitating a more uniform temperature distribution at the interior thereof.

It is in fact evident that in order to obtain high quality levels in the printed circuits that are produced with these presses, the distribution of the temperatures in the pile must be as uniform as possible, since otherwise there is the risk of having, at the interior thereof, multilayer stacks in which the thermosetting resins are correctly polymerized and other zones where they are not, or where they are excessively polymerized. In other words, it is clear that if all the points of the pile of multilayer stacks do not reach the same temperature at a specific time instant, except possibly for a certain variable tolerance margin in accordance with the materials, there will be zones that are not sufficiently hot or others excessively heated, in which the synthetic resins of the pre-preg layers are not hardened or are overheated (those skilled in the art also call this "cooked"), such that the relative printed circuits must be discarded.

On this matter, it must be underlined that due to the current trends that depend, above all, on the development in the telecommunications field—where cell phones or other portable devices carry out increasingly numerous and complex functions, therefore requiring high calculation power while maintained reduced size and weight—printed circuits must be increasingly compact and light.

Consequently, this means that the conductive copper sheets or layers with the topography of the circuit, and the insulating pre-preg sheets or layers constituting them, must also be very thin in order to be able to stack a greater number thereof and obtain the desired performances of the circuits.

In order to give a better idea of the object of discussion: each conductive and pre-preg sheet or layer has a thickness of about 80-100 μm, in accordance with the case: therefore, this requires a high processing precision, with tolerances that are on the order of thousandths of a millimeter (i.e. μm).

In addition, each stack can comprise a number of these layers that can vary from several units (4-8) to tens of units (20-30), such that the piles of multilayer stacks that are loaded on the presses and which usually comprise three or four of these, stacks have an overall height of about 15-20 centimeters.

The temperature control must therefore be adapted to these stringent precision criteria, and therefore it is necessary to operate on each aspect of the thermal pressing cycle, in order to attain the required performance levels.

In this context, the applicant has found that temperature differences were verified between the peripheral zones of the pile of multilayer stacks and the central zones, likely due to the fact that the peripheral zones are those closest to the upper and lower plates that operate the compaction of the layers, which thus have a thermal capacity different from the rest of the pile.

A second type of press for soldering and compaction of the multilayer stacks designed by the present applicant, is described in the Italian patent application MI2003 A 000967, published as WO2004103042A1. Unlike the preceding one, this press is of inductive type and therefore the heat is provided to the multi layer stacks by means of electromagnetic radiation, without thermal conduction of heating plates or foils.

In particular, the press comprises a ferromagnetic yoke configured as a "C" (or horseshoe, if desired), with a vertically arranged central core, on which an electric winding inductor is applied, an upper arm and a lower arm which are horizontally extended from the central core.

The upper arm of the ferromagnetic structure can vertically translate in order to compress the multilayer pile which is set on the lower arm.

By supplying the winding with an alternating current with pre-established frequency, it is possible to induce electric currents in the copper conductive layers of the pile of multilayer stacks, which heat them, so as to obtain the heat required for the melting and polymerization of the thermosetting resin that impregnates the insulating pre-preg layers.

In this case, however, it is difficult to control the heat partiting in order to make it uniform between the central points of the pile and the more peripheral points, due to the fact that the magnetic induction flux that traverses the pile is not uniform along its height and even width.

The presses made according to this known solution therefore do not solve the drawbacks of the preceding endothermic or resistive presses.

In light of this situation, an object of the present invention is therefore to provide a press for making printed circuits, which has structural and functional features such to overcome the limits of the above-considered presses known from the state of the art.

In other words, the invention aims to provide a press that allows to obtain a uniform distribution of the temperature in the various points of the pile of the multilayer stacks that are processed.

Within the scope of this aim, a further object of the invention is to provide a press that allows to control the temperature variation over time, in the pile of di multilayer stacks.

These and further objects of the invention are attained by a press whose characterizing features are specifically set forth in the appended claims; such features, the effects that derive therefrom and the advantages achieved by the invention, will become clearer from the description reported hereinbelow of a possible embodiment thereof, with reference to the enclosed drawings provided as a non-limiting example, in which:

FIG. 7 is a plan view of the panel of FIG. 6;

FIG. 8 is a section view along the line VIII-VIII of FIG. 7;

Figure 1:
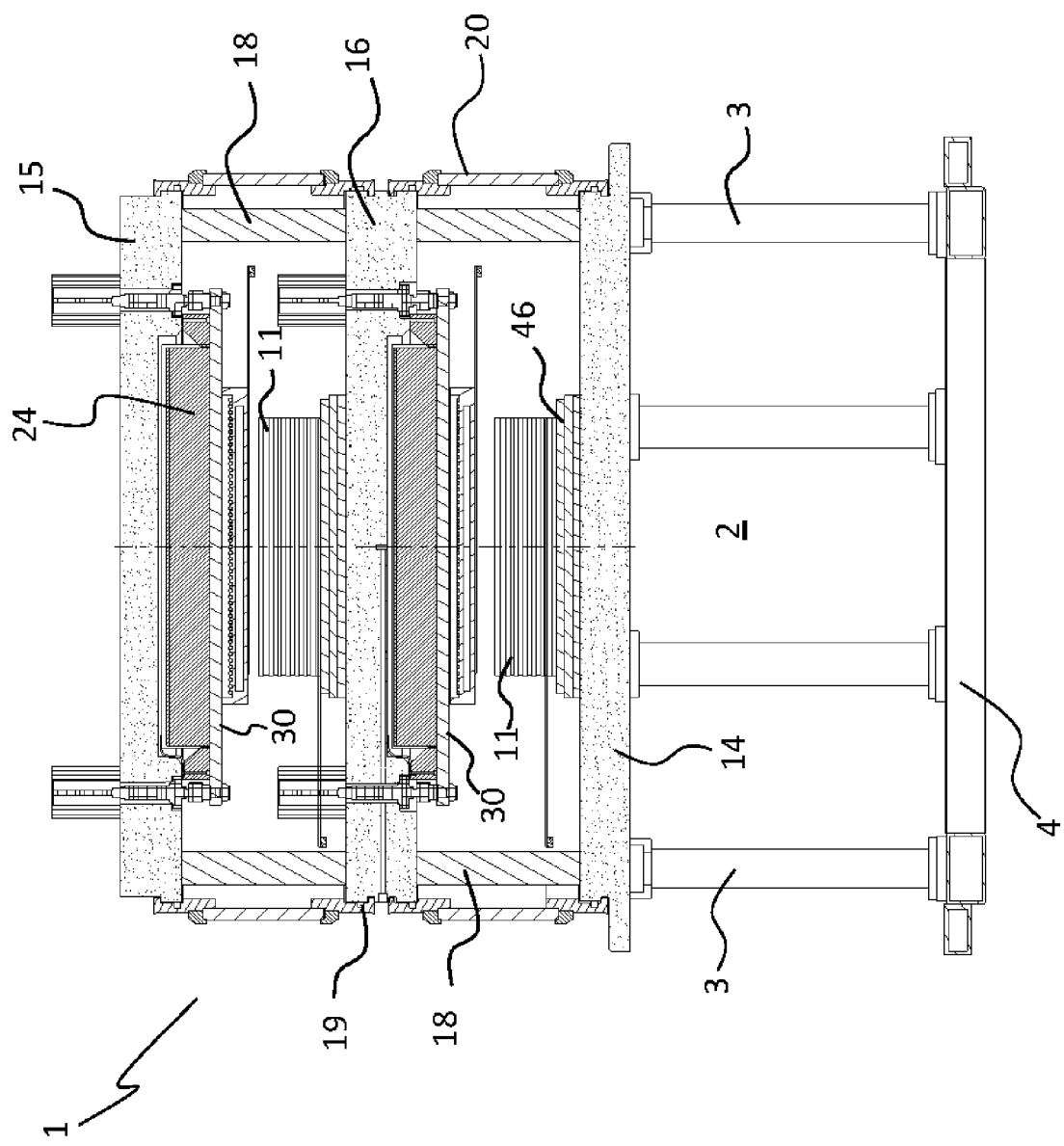
FIG. 1 shows a front view of a press in accordance with the invention.

Before proceeding with the detailed description of the press of the invention, illustrated in the above-listed drawings, it is necessary to first state that particular configurations and/or structures and/or features described hereinbelow regarding the non-limiting example can be considered separately or combined in any suitable manner, in one or more embodiments, also different from the exemplified embodiments; in addition, the references used hereinbelow are only for convenience and do not define the protective scope or the shape of the embodiments.

Therefore, definitions like "upper", "lower", "above", "below", "high", "low" refer to the exemplifying figures and must not be intended as limiting.

Furthermore, hereinbelow reference will be generically made for the sake of brevity to multilayer stacks, piles, stacking or the like, addressing for more information on their configuration to what is known in the art. As will be better understood hereinbelow, the invention is in fact advantageously applied to all the multilayers for the production of printed circuits, regarding which a brief outline was given above.

In the light of what has been stated hitherto, it can be stated that the soldering press according to the invention, has been indicated overall with the reference number 1.

The press comprises a base 2 which in this case is constituted by a series of columns 3 set on a base frame 4; of course, any other appropriate solution may be employed for making the base, for example with beam trusses, concrete foundations or reinforced concrete foundations, brick walling, combinations or one or more of these alternatives, among other solutions.

The selection of the configuration of the base 2 will depend on various factors, including the size of the press 1, the type of plant in which it is installed (in line or with production islands), the availability of surrounding spaces, among other factors.

Figure 2:
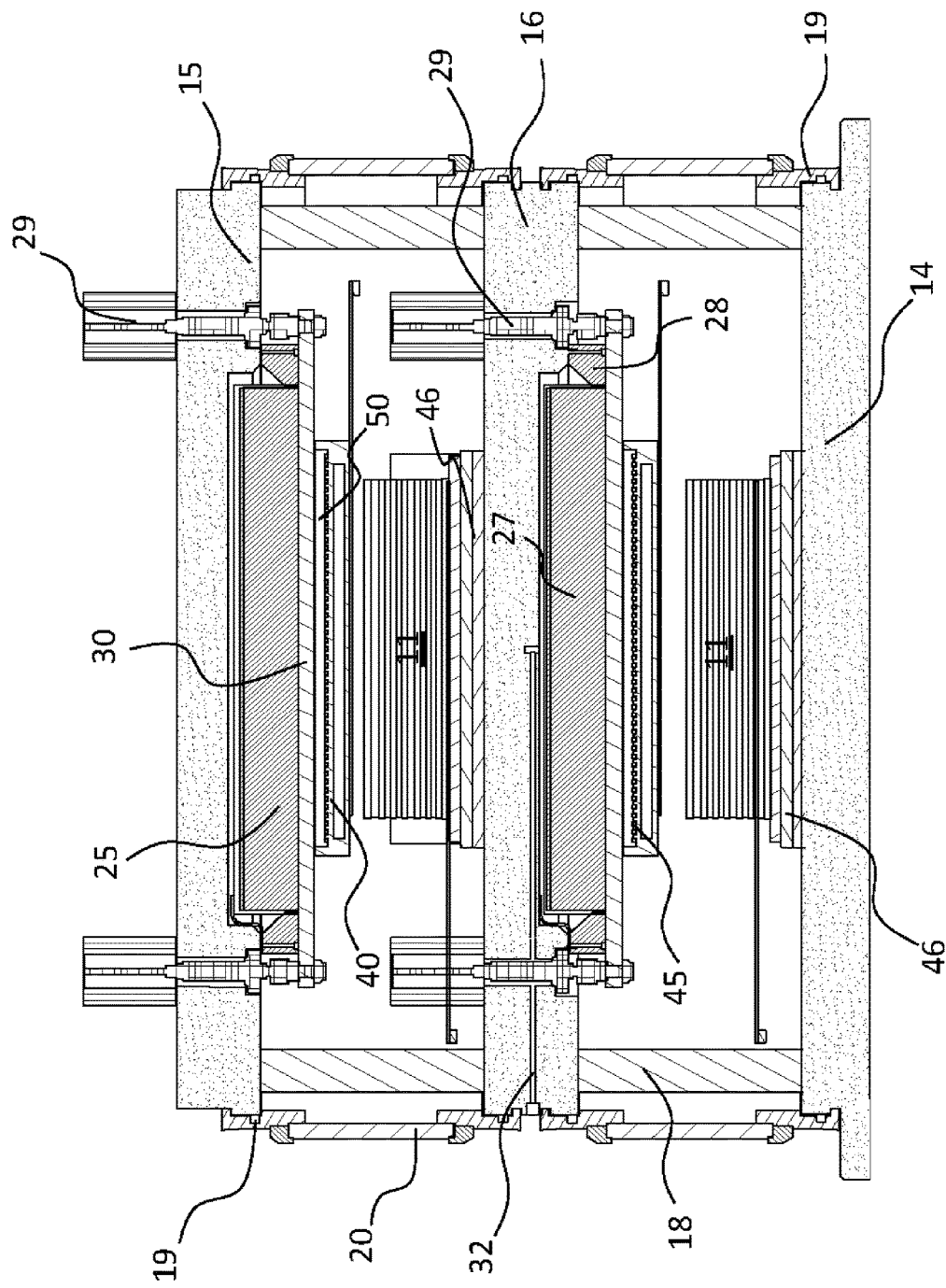
FIG. 2 is an enlarged view of a part of the press of FIG. 1.
Figure 3:
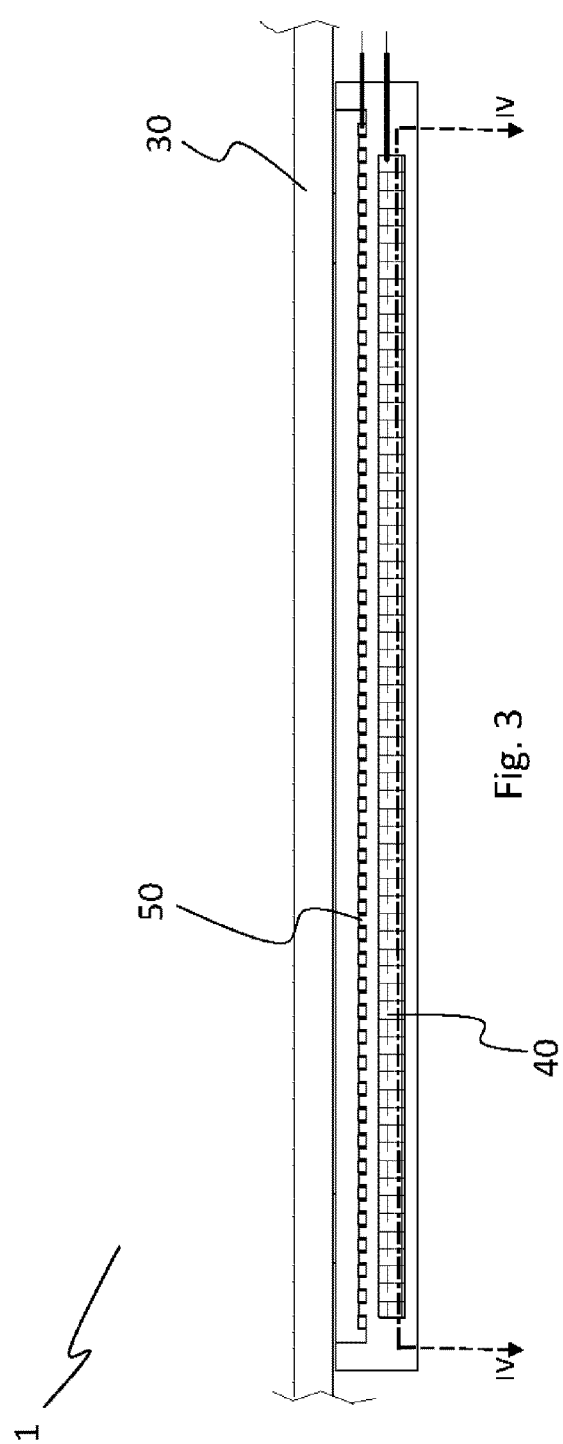
FIG. 3 shows a detail of the press of FIG. 1.
Figure 5:
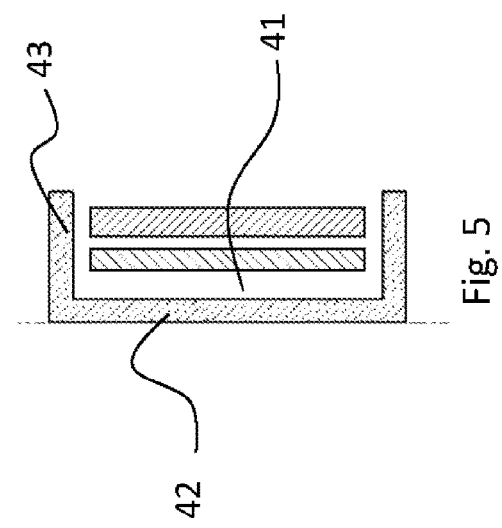
FIG. 5 is a section along the line V-V of FIG. 4.
Figure 4:
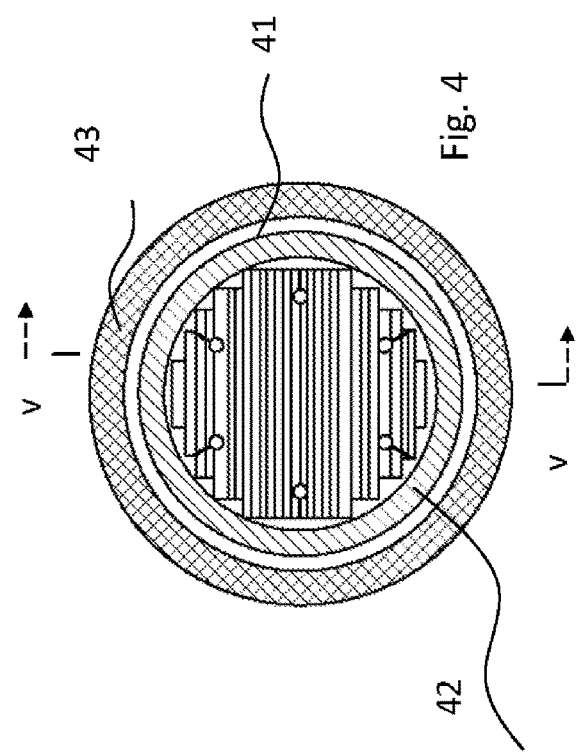
FIG. 4 is a section along the line IV-IV of FIG. 3.
Figure 6:
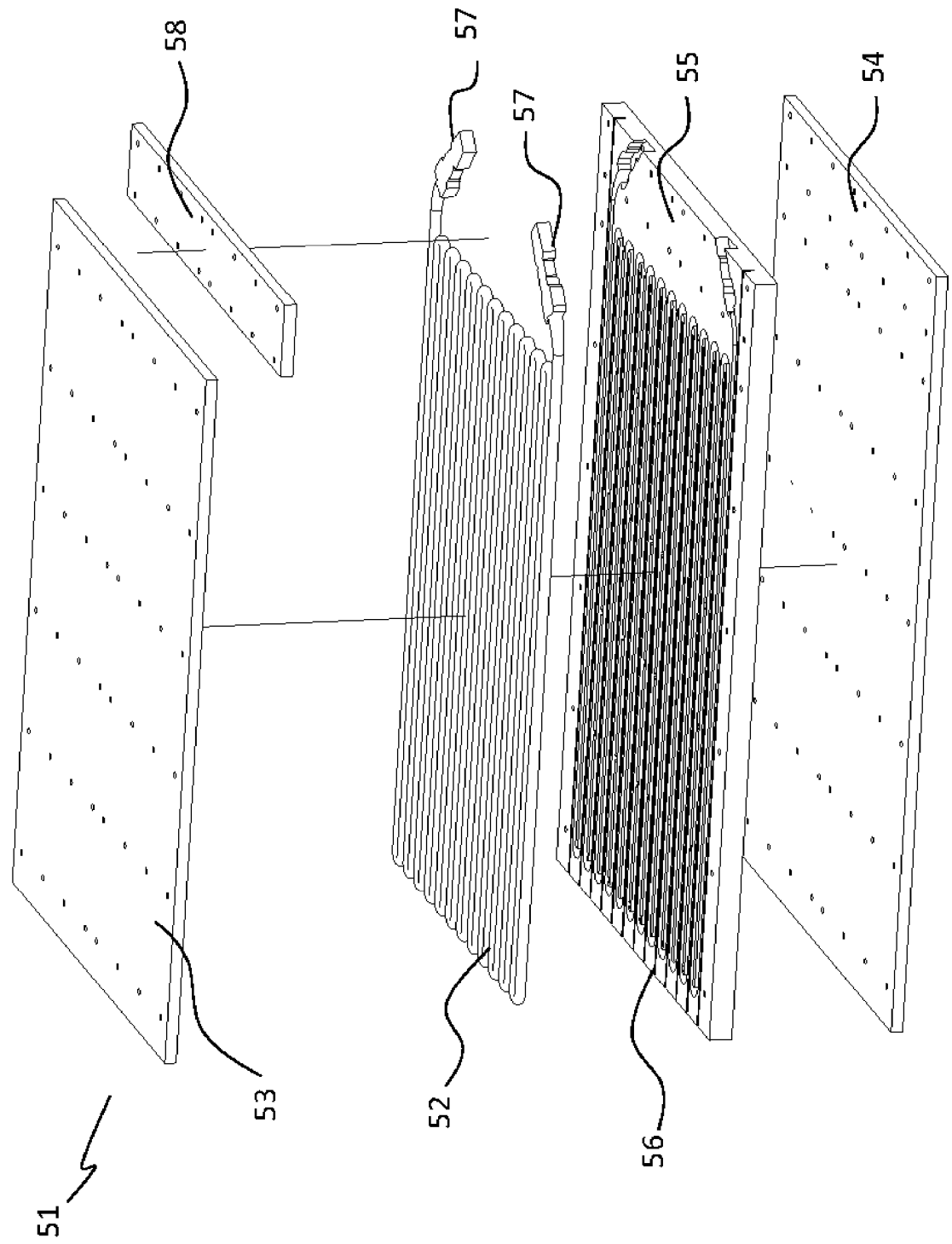
FIG. 6 is an exploded view of a heating panel of the press of FIG. 1.

The base 2 supports the muffle 10 of the press, where the multilayer stacks 11 are heated and pressed; the muffle 10, better visible in FIG. 2, is essentially a structure with parallelepiped form or the like, delimited at the bottom and top respectively by a lower base or wall 14 and by an upper top or wall 15, constituted by rigid thick plates, preferably made of ferromagnetic metal such as ferrite, magnetite, silicon steel, on its own or as an alloy with other metals and/or appropriate materials.

Between the base 14 and the top 15 of the muffle 10, an intermediate or dividing wall 16 is present that is similar to the others, which is thus preferably made of the ferromagnetic material mentioned above; the base 14, the top 15 and the intermediate wall 16 are fixed on uprights 18 vertically arranged along the corners of the muffle, which constitute the support framework or frame thereof.

The muffle 10 is in fact a structure in which a vacuum is made during the process of heating and pressing the multilayer stacks 11; it must therefore have properties of resistance to the pressure difference between the outside and inside environments, which can reach values on the order of 0.4-0.8 bar.

For this reason the muffle 10 is laterally closed by walls 19, on some of which there can be arranged transparent glass panels 20, in order to allow viewing inside the muffle; these are in any case panels made with thickness and materials suitable for resisting the stresses induced by the vacuum generated inside the muffle during the working process.

The intermediate wall 16 internally divides the muffle into two chambers, respectively a lower chamber 22 and an upper chamber 23; in each chamber 22, 23, a respective actuator or pneumatic pressure group 24, 25 is present which serves for applying the force required to form the printed circuits, according to the normal thermal pressing process. Since the actuators 24, 25 are identical to each other, only one of these is described hereinbelow, since the same explanation also applies to the other.

Therefore, considering the lower actuator 24 as reference, this comprises a piston 27 with circular geometry, slidable in a cylinder 28 fixed to the intermediate wall 16 which also supports means for guiding the movement of the piston 27, constituted by telescopic stems 29 fixed to a thrust plate 30 mounted on the piston 27.

The internal volume of the cylinder 28 is in fluid communication, by means of ducts 32, with an external pressurized air supply group, not shown in the drawings since per se known; such group comprise, among other things, a compressor for processing pressurized air, solenoid valves for intercepting the compressed air which serves for the pneumatic operation of the piston 27. Even if pneumatic actuation of the piston 27 is preferable since it allows obtaining good movement speed and thus a readiness of the press, other solutions could also be used for driving the piston 27.

For example, fluids different from air can be employed, in particular non-gaseous fluids such as oils for the oil-dynamic actuation of the piston; as an alternative to the fluids, or in combination thereof, the actuator 24 can be electromechanical, for example with a stepper electric motor that drives the movements of the piston, or with an electric motor and a screw reducer.

It should be indicated that it is also possible to have multiple actuators that drive the piston, such as jacks (hydraulic or electric) which operate together on the piston 27.

On the other side of the plate 30, with respect to that directed towards the piston 27, magnetic inductor means 40 are applied, which comprise at least one winding 41 arranged with axis parallel to the direction of motion of the piston 27 which is preferably vertical, around a ferromagnetic core 42.

The inductor means can comprise only one winding 41 placed on the core 42 or also other windings, as in this case, where a second winding 43 is further arranged around the first, coaxial and external; the configuration and the electrical power supply of the windings 41 and 43 nevertheless must be such to allow adjusting and/or increasing the overall magnetic induction flux, as required for the objects which will be clarified hereinbelow. The inductor means 40 can in any case be configured differently from that just described.

For example, there can be other coaxial windings around those 41, 43 of the figures, or there can be a plurality of smaller coils, in place of the single inductor with one or both windings 41, 43; such coils can be distributed in an equidistant manner, so as to obtain a overall magnetic induction flux that is uniform over the surface of the multilayer stacks 11.

The core 42 of the inductor 40 is made of a material permeable to a linked magnetic flux generated by the windings 41, 43, when the latter are excited with an alternating current having a frequency on the order of several kHz, preferably 18 kHz to 30 kHz, and in the specific case about 24 kHz.

The material permeable to the magnetic flux constituting the core 42 is preferably ferrite: by using ferrite, it is possible to limit the parasitic currents induced by the variable magnetic flux; the core can be constituted by blades joined as a stack, as shown in the drawings, or by a solid ferrite body.

The windings 41, 43 have a relatively low number N of coils, 20 to 35 and preferably 30, made of conductive material (e.g. copper or alloys thereof), of circular section with diameter suitable for the specific application.

Indeed, the higher the power required for soldering the multilayer stacks 11, the greater the section of the conductors 41, 43 will have to be; it must also be indicated that in accordance with the number of coils and the type of multilayer stacks 11, the power supply current of the windings 41, 43 varies from 10 to 14 Ampere with a voltage that can range from 300 to 560 Volt.

Irrespective of how they are made, the inductor means 40 are preferably housed in a block 45 made of electrically insulating material and having good mechanical and thermal strength, so as to resist the compression stresses exerted on the stack of multilayers 11, with the relative temperatures.

For this reason, the block 45 can be made of synthetic materials, thermoplastic or thermosetting, such as polytetrafluoroethylene (PTFE, also termed "teflon"), some polycarbonates, polyurethanes and PVC (polyvinylchloride), possibly reinforced with charges of additives that increase the mechanical and/or thermal strength thereof; nevertheless, in order to make the block 45, dielectric materials can also be used such as vitreous or ceramic materials, mica etc.

In accordance with a preferred embodiment of the invention, heating means 50 are also present in the block 45.

Such heating means comprise a heating panel 51 preferably having a composite structure, in which an electric resistor 52 is interposed between two outer faces or plates 53, 54; in particular, the resistor 52 is configured as a coil and is supported in a tray 55 electrically insulating and resistant to high temperatures, on the order of 100-200° C.; for such purpose, the tray 55 is made of ceramic and/or vitreous material or even mica and some of the other materials mentioned above for the block 45.

Preferably the resistor 52 is made of conductive material adapted to maintain a uniform behavior upon temperature variation, i.e. its electrical resistivity does not substantially change with the temperature, except for a reasonable tolerance margin which is usually a few percentage points (1-3%).

For this reason, the resistor is preferably made of stainless steel or in any case with ferrous alloys, and advantageously its cross section is preferably polygonal, square or rectangular, since this allows better maintaining the mechanical properties with the heating.

The resistor 52 is supplied with direct current (DC) under low voltage, on the order of several tens of volts, but with high electrical current values, i.e. about 15-20 Ampere; for an improved performance and efficiency of the heating means 50, the resistor 52 is housed in a seat 56 with mated shape present in the tray 55.

At the ends of the resistor 52, connectors 58 are arranged for the connection with the electrical power supply means, not shown in the drawings; the connectors 58 are substantially terminals, also housed in a portion 56a of the seat 56 of the tray 55.

As is seen in the figures, the outer faces 53, 54 of the panel are plates, made of glass or fiberglass, carbon, mica, magnesium or even anodized aluminum, or another material; independent of the selection of the material of the face 53 of the panel 51, i.e. that directed towards the multilayer stack 11, this preferably has good properties of irradiation so as to facilitate the transmission of the heat to the adjacent multilayer stack 11.

For such purpose, the selection of the constituent material will also take into account for the radiating properties thereof; reinforcement charges of fiberglass and/or surface finishes of the face 53 can therefore be provided which facilitate the radiating effect, along with the pigmentation or coating with paints.

The plate of the face 53 can be made of carbon or in any case comprise this element dispersed in a matrix of another kind, in one of its allotropic forms such as graphite, graphene, nanotubes or others, thereby allowing to obtain good physical (thermal and electrical) and mechanical properties (compressive strength and thermal stress strength).

Carbon also has good emissivity property in the infrared range and this facilitates the transmission of the heat by the panel 51 to the multilayer stacks 11 to be pressed.

Advantageously, in the embodiment shown in the drawings, the plate 53 of the panel 51 has smaller size than the other, so as to leave the connectors 57 uncovered: this facilitates the mounting of the resistor 52 and the electrical connection of the connectors 57, which are also housed in a portion of the seat 56 arranged in the tray 55; for the closure of the panel, a cover 58 is provided.

Furthermore, the faces 53, 54 of the panel are mutually fixed together with the tray 55 by means of screws, rivets or similar fixing means, so as to form a rigid and resistant structure that is rigid and resistant from the mechanical standpoint to the stresses deriving from the pressing of the multilayer stacks 11. For the working of the latter in the press 1, such stacks are supported in the respective chambers 22, 23, on the base 14 and on the dividing wall 16; in particular, according to a preferred embodiment of the invention, the multilayer stacks 11 are set on a pedestal 46 which facilitates the heating and the magnetic induction of the multilayer 11.

For this purpose, the pedestal 46 can be made as the block 45 associated with the plate 30 moved by the piston 27, i.e. with heating means 50, which preferably are like the panel 51 with composite structure, and inductor means 40 comprising at least one winding 41 associated with a core 42, like those seen above. The operation of the soldering press 1 described above takes place as explained below.

The multilayer stacks 11 are arranged in the lower chamber 22 and in the upper chamber 23, abutting them against the corresponding pedestal 46; once the vacuum in the chambers 22, 23 is made, it is possible to operate the steps of heating and pressing.

Regarding the first step, this is carried out in a controlled mode, ensuring that the temperature of the multilayer stack 11 progressively increases over time with a progression of a curve with increasing derivative, which is typically configured as a "ramp" in a Cartesian diagram where time is reported on the x axis and the temperature is reported on the y axis.

Of course, there can in any case be other growth progressions of the temperature over time, not necessarily rectilinear: this will depend on various factors such as, for example, the type of printed circuits to be obtained and/or their topography, the characteristics of the thermosetting resins of the prepreg, the thickness of the multilayer stacks 11 and/or that of the various constituent sheets.

The temperature progression is detected by means of probes arranged in the multilayer stack 11, which is internally heated due to the induced electric currents that are produced in its conductive layers, deriving from the magnetic induction generated by the inductor means 40.

In this context, it must be observed that the inductor means 40 are configured in a manner such to preserve their structural characteristics substantially unaltered, even upon variation of the configuration of the system following the pressing of the multilayer stack 11.

Indeed, the pressing of the latter and its height reduction caused by the action of the pneumatic piston 27, do not affect the magnetic induction generated by the inductor windings 41, 43 and by the coupled core 42, since they remain unaltered and are integral with the piston 27.

In other words, it can be stated that in the press according to the invention, the ferromagnetic core 42 associated with the inductor windings 41, 43 does not change its configuration when the multilayer stack 11 is compressed by the piston 27: this allows having a reliable and precise control over the heating of the multilayer 11, since the characteristics of the inductor means 40 remain unchanged in the course of the process (unlike what occurs in the solution described in the above-considered state of the art).

Furthermore, the arrangement of the inductor means 40 in which the windings 41, 43 have axis substantially parallel to that of the stacked multilayer stacks 11 allows obtaining a more uniform magnetic induction whose flux lines traverse the multilayer stacks 11 in a manner substantially perpendicular to the single layers, thus maximizing the effect of generating the electromotive force that originates the electric currents in the conductive layers.

This effect is also facilitated by the fact that the inductor means 40 are preferably arranged both at the top on the piston 27 and at the bottom in the pedestal 46: this allows having a configuration of the system that is equivalent at the top and bottom with respect to the multilayer pile 11, so as to obtain an improved control of the temperature at its interior.

For such purpose, it must be observed that the control of the temperature and its uniform distribution inside the multilayer pile 11 is further facilitated by the presence of the heating means 50 arranged at the block 45 and at the pedestal 46.

Such heating means, which in this embodiment comprise a radiating panel 51, in fact allow eliminating or in any case reducing the thermal differences between the peripheral zones, i.e. those at the ends, and the internal central zones of the multilayer 11. Indeed the latter tend to be heated more than the peripheral zones, which are subjected to edge effects and to the contact with the block 45 and the pedestal 46; the presence of the heating panels 41 makes possible the localized heating of the peripheral zones of the multilayer piles 11, so as to make their temperature uniform with that of the central zones.

From that stated up to now, it is therefore possible to understand that the press according to the invention attains the object at its base, as reported above.

Indeed, it is able to ensure a heating of the multilayer piles 11 for printed circuits, with a distribution of the temperatures that is uniform in the peripheral points and in the internal points; this at least partly depends on the fact that the use of the magnetic induction allows heating the more internal zones of the stacking multilayer 11, without the risk of overheating them, consequently damaging the thermosetting resins of the insulating prepreg layers.

Indeed the induced magnetic flux from the inductor means 40 generates electric currents in the conductive layers of the stacking 11, so as to heat those which are situated in the more internal points; this effect is further improved by the fact the inductor means 40 can be positioned at the top and bottom with respect to the multilayer stacking 11, i.e. in the block 45 associated with the piston 27 and in the pedestal 46 on which it is set.

The presence of the heating means 50 in the block 45 and in the pedestal 46 also allows eliminating the edge effects and thus obtaining a uniform distribution of the temperatures in all points of the multilayer 11, both peripherical and more internal points.

The heating of the multilayer stacks 11 thus conceived can be controlled in a precise and effective manner, thereby ensuring a high level of quality of the printed circuits obtained with the press of the invention.

It must also be underlined that these important results are achieved with a press that has high productivity, given that it can operate simultaneously on at least two multilayer stacks 11, respectively arranged in the lower chamber 22 and in the upper chamber 23.

For such purpose, it is necessary to underline that in press 1 it is possible to obtain the vacuum in the lower and upper chambers 22, 23 by using the same means (not shown in the drawings since per se known), comprising a compressor, ducts and solenoid valves for intercepting the air, with a clear simplification of the press 1 while simultaneously maintaining high productivity given that 2 multilayer stacks 11 can be soldered.

For such purpose, a synergistic effect must be emphasized since the welding of two (or more) multilayer stacks according to the teaching of the invention, allows to reach performances that are much improved in terms of processing times and control of the temperature of the two multilayer stacks, with respect to that of a single multilayer stack of thickness equal to the sum of the two.

Indeed, by operating on separate stacks 11 having a respective lower number of layers, it is possible to carry out a quicker and more precise heating.

Therefore, in the press 1, the above-described cycle is executed, i.e. the inductor means 40 of the two chambers 22, 23 are power supplied and the respective multilayer stacks 11 present at their interior are pressed; it is comprehensible that by following this principle, it is possible to make presses with a number of pressing chambers greater than the two of the shown embodiment. This is due to the modular configuration of the press, in which each chamber 22, 23, . . . n, can be equipped with respective inductor means 40 and pressing means 25, 27 functioning in an autonomous manner.

Naturally, variants of the invention are possible with respect to that described up to now.

Different possible alternatives have already been mentioned above with regard to the shape and the materials constituting the inductor means 40, the pressing means 25, 27 or the heating means 50 at the ends of the multilayer stack 11; in this circumstance, it is necessary to add that in order to increase the thermal effect inside the multilayer stack 11, the applicant has found that it is possible to apply a conductive foil 60 folded between the layers of the stacks 11.

Figure 9:
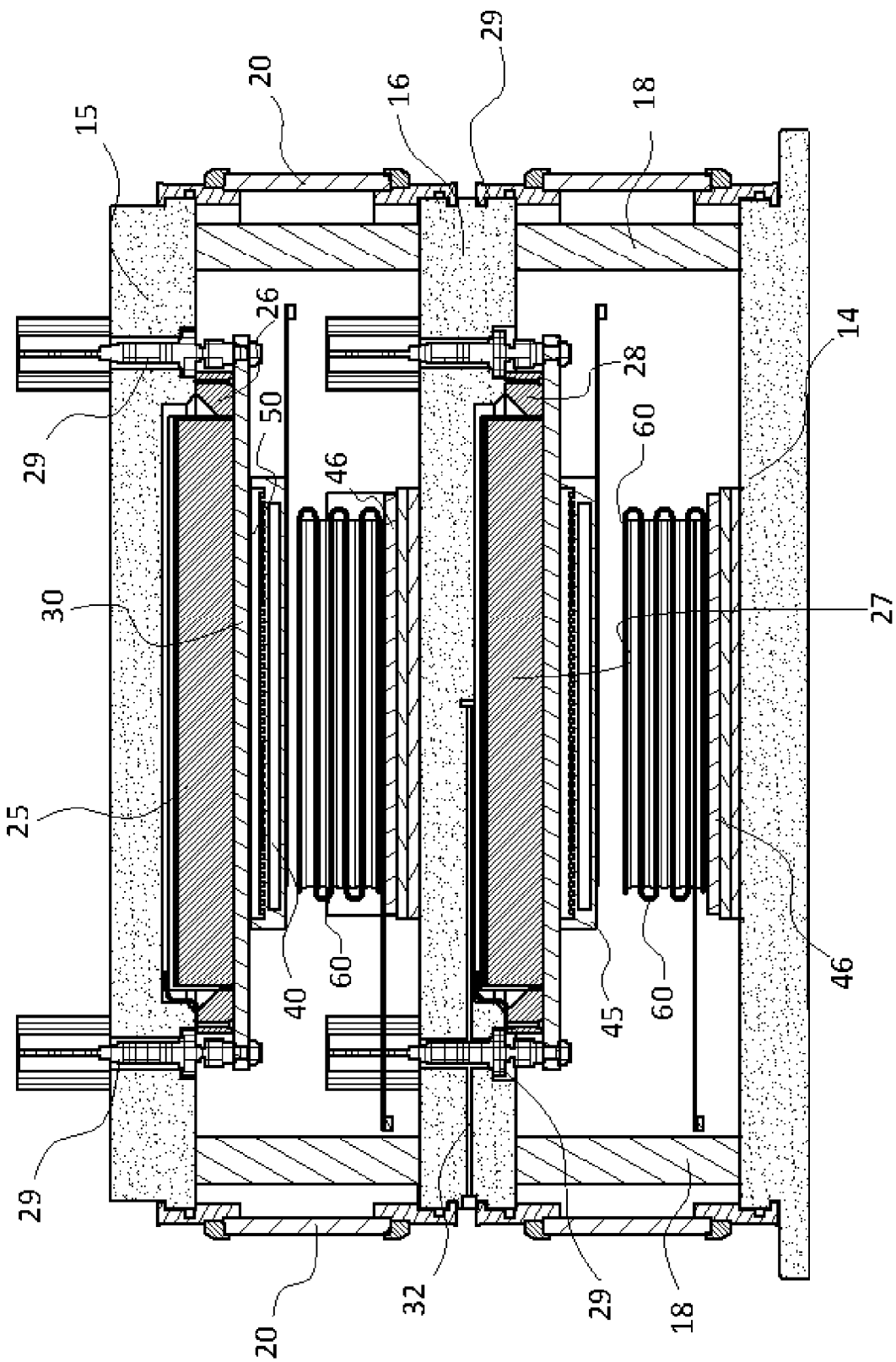
FIG. 9 shows the detail of the press of FIG. 3, during a step of the soldering process according to the invention.
Figure 11:
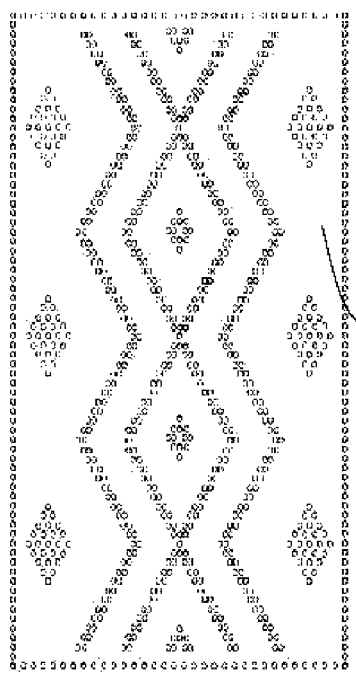

This situation is shown in FIG. 9, which reports a view corresponding to that of FIG. 2 of the press 1, wherein a conductive foil 60 is associated with the multilayer stacks 11. The foil 60 is preferably made of copper or another electrically conductive material, with a thickness that can vary in accordance with the application between 0.5 mm and 1.5 mm; the size of the foil 60, not only the thickness but also the width and length, depend on various factors such as the height of the multilayer stacks 11, their composition with the prepreg layers, the design (i.e. topography) of the circuits to be printed, etc.

As shown in FIG. 9, the foil 60 is turned up into folds interposed between the layers of the stacks 11; also in this case, the number of the bent folds of the foil 60 depends on the stacks 11 and on their layers.

Surprisingly, the applicant has observed that the presence of the foil 60 bent into folds in the multilayer stacks 11 facilitates the heating thereof, both in terms of uniformity of the distribution of the temperatures and of heating times, with respect to that known in the art, for example from the Italian patent application MI2003 A 000967.

In fact, in the latter document, the induction that traverses the multilayer stacks allows heating the conductive layers at their interior, but in a manner that is not very uniform since the mutual induction of each foil, insulated from the adjacent foils, interferes with the magnetic flux.

However, in the solution of the present invention, the bent folds are part of a single foil 60, such that they behave with the same inductance when the magnetic flux is generated inside the multilayer stack 11, by the inductor means 40.

In practice, it can be stated that the bent folds of the foil 60 behave like the coils of a same inductance (i.e. one coil), such that when they are traversed by the magnetic flux, a same electric current runs through the foil 60 which heats it in an effective manner.

For such purpose, it is necessary to observe that by appropriately selecting the parameters of the soldering process, such as the size and shape of the foil 60, the number of folds with which it is folded (and thus their pitch), the supply frequency of the inductor means 40 (as stated above) and the magnetic induction flux generated thereby, it is possible to ensure that a uniform electric current circulates in the foil 60, which accounts both for that induced by the magnetic flux and that self-induced by the current in the foil 60.

For this purpose, different forms of the foil 60 can be provided for; for example, it can be constituted by a sheet or strip of uniform width, or shaped like a chain of ring-shaped coils or the like, connected to each other, in which the coils are arranged at the horizontal folds in the foil 60 folded between the stacks of FIG. 9.

Figure 10:
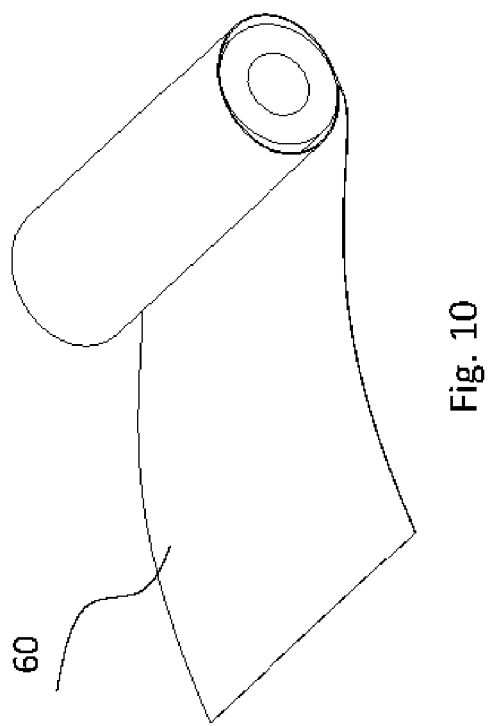
FIG. 10, 11, 12 show respective examples of electroconductive foils for actuating the soldering process of FIG. 9.
Figure 12:
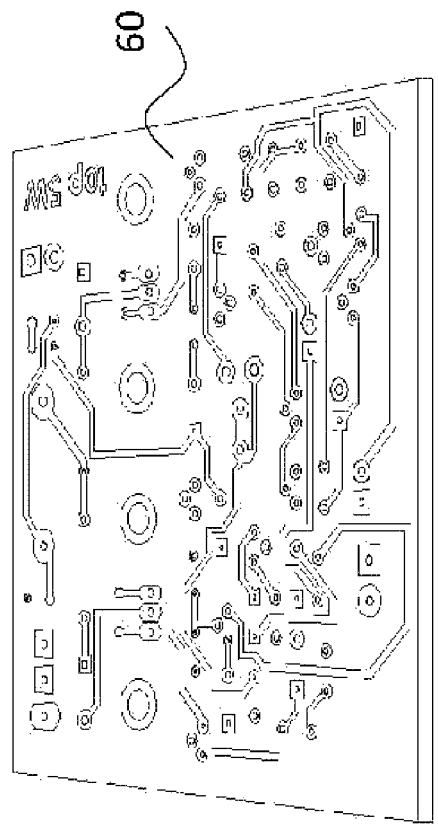

Advantageously, the coils can also be designed and/or configured as a function of the topography of the printed circuits and/or of the layers of the stacks 11, so as to make their inductive heating by means of the magnetic flux traversing them more efficient. Some examples of configuration of the foil 60 are shown in FIG. 10.

All of these variants in any case fall within the scope of the following claims.

The invention claimed is:

1. A soldering press of multilayer stacks for printed circuits, comprising:
   a muffle, the muffle comprising a base wall, a top wall, and outer walls, wherein the base wall, the top wall, and the outer walls define at least one soldering chamber configured to receive a multilayer stack to be processed;
   a plurality of uprights fixing the top wall relative to the base wall; and
   a pressure group attached to the top wall, the pressure group comprising an actuator, a first inductor, a thrust plate, and a heater,
   wherein the actuator is configured for moving the thrust plate in a direction of motion towards the base wall to apply a force onto the multilayer stack,
   wherein the first inductor is adapted to induce a magnetic flux in the multilayer stack for heating it, the first inductor comprises two electric windings, and the two electric windings of the first inductor are arranged with axes parallel to the direction of motion of the actuator of the pressure group around a ferromagnetic core and are coaxial with one of the two electric windings of the first inductor arranged around the other electric winding of the first inductor, and
   wherein the heater of the pressure group is housed in a block associated with the first inductor and comprises a heating panel, and the heating panel of the heater of the pressure group comprises an electric resistor having a composite structure and at least partly interposed between a pair of outer faces.

2. The soldering press of claim 1, wherein the actuator further comprises: a piston operated by a fluid.

3. The soldering press of claim 1, wherein the base wall further comprises: a second inductor; and
   the second inductor is adapted to induce a magnetic flux in the multilayer stack for heating it, the second inductor comprises two electric windings, and the two electric windings of the second inductor are arranged with the axes parallel to the direction of motion of the actuator of the pressure group around a ferromagnetic core and are coaxial with one of the two electric windings the second inductor arranged around the other electric winding the second inductor.

4. The soldering press of claim 1, wherein the base wall further comprises: a heater; and
the heater in the base wall is housed in a block associated with the second inductor and comprises a heating panel, and the heating panel of the heater in the pressure group comprises an electric resistor having a composite structure and at least partly interposed between a pair of outer faces.

5. The soldering press of claim 1, wherein the first inductor is at least partly housed in a block associated with the actuator of the pressure group.

6. The soldering press of claim 1, further comprising: a plurality of overlapped soldering chambers within the muffle.

7. The soldering press of claim 1, further comprising: a tray that supports the electric resistor.

8. The soldering press of claim 1, wherein the heating panel radiates heat and wherein at least one of the outer faces is made of a material suitable for irradiation in an infrared field.

9. The soldering press of claim 1, wherein the induced magnetic flux is with a frequency of 18 kHz to 30 kHz.

10. A method of soldering multilayer stacks using the soldering press of claim 1, wherein at least one electroconductive foil is bent into folds between layers of the multilayer stacks.

11. The method of claim 10, wherein the at least one electroconductive foil is configured as a tape.

12. The method of claim 10, wherein the at least one electroconductive foil is at least partly configured with coils connected and/or linked together.

13. A soldering press of multilayer stacks for printed circuits, the soldering press comprising:
a muffle, the muffle comprising a base wall, a top wall, an intermediate wall, and outer walls,
wherein the base wall, the intermediate wall, and the outer walls define a first soldering chamber configured to receive a first multilayer stack to be processed, and
wherein the top wall, the intermediate wall, and the outer walls define a second soldering chamber configured to receive a second multiplayer stack to be proceed;
a first plurality of uprights fixing the top wall relative to the intermediate wall;
a second plurality of uprights fixing the base wall relative to the intermediate wall;
a first pressure group attached to the intermediate wall, the first pressure group comprising a first actuator, a first inductor adapted to induce a magnetic flux in the first multilayer stack for heating it, a first thrust plate, and a first heater, wherein the first actuator is configured for moving the first thrust plate in a direction of motion towards the base wall to apply a force onto the first multilayer stack; and
a second pressure group attached to the top wall, the second pressure group comprising a second actuator, a second inductor adapted to induce a magnetic flux in the second multilayer stack for heating it, a second thrust plate, and a second heater, wherein the second actuator is configured for moving the second thrust plate in a direction of motion towards the intermediate wall to apply a force onto the second multilayer stack;
wherein the first inductor comprises two electric windings, and the two electric windings of the first inductor are arranged with axes parallel to the direction of motion of the actuator of the pressure group around a ferromagnetic core and are coaxial with one of the two electric windings of the first inductor arranged around the other electric winding of the first inductor;
wherein the first heater of the pressure group is housed in a block associated with the first inductor and comprises a heating panel, and the heating panel of the first heater of the first pressure group comprises an electric resistor having a composite structure and at least partly interposed between a pair of outer faces;
wherein the second inductor comprises two electric windings, and the two electric windings of the second inductor are arranged with axes parallel to the direction of motion of the actuator of the pressure group around a ferromagnetic core and are coaxial with one of the two electric windings of the second inductor arranged around the other electric winding of the second inductor; and
wherein the second heater of the pressure group is housed in a block associated with the second inductor and comprises a heating panel, and the heating panel of the second heater of the second pressure group comprises an electric resistor having a composite structure and at least partly interposed between a pair of outer faces.

14. The soldering press of claim 13,
wherein the heating panels of the first heater and the second heater radiate heat and at least one of the outer faces is made of a material suitable for irradiation in the infrared field.

15. A soldering press of multilayer stacks for printed circuits, the soldering press comprising:
a muffle, the muffle comprising a base wall, a top wall, and outer walls, wherein the base wall, the top wall, and the outer walls define at least one soldering chamber configured to receive a multilayer stack to be processed, the muffle further comprising a plurality of overlapped soldering chambers within the muffle;
a plurality of uprights fixing the top wall relative to the base wall; and
a pressure group attached to the top wall, the pressure group comprising an actuator, an inductor, a heater, a thrust plate, and a heater,
wherein the actuator is configured for moving the thrust plate in a direction of motion towards the base wall to apply a force onto the multilayer stack,
wherein the inductor adapted to induce a magnetic flux in the multilayer stack for heating it, wherein the induced magnetic flux is with a frequency of 18 kHz to 30 kHz,
wherein the actuator further comprises a piston operated by a fluid,
wherein the heater is housed in a block associated with the inductor and comprises a heating panel having a composite structure, wherein the heater comprises an electric resistor is at least partly interposed between a pair of outer faces or plates, and
wherein the inductor comprises two electric winding, and the two electric windings are arranged with axes parallel to the direction of motion of the thrust plate around a ferromagnetic core and are coaxial with one of the two electric windings arranged around the other electric winding, and wherein the inductor is at least partly housed in a block associated with the actuator of the pressure group.

* * * * *